METHODS OF ETCHING A SEMICONDUCTOR DEVICE

Filed March 31, 1959 2 Sheets-Sheet 1

INVENTOR
JERRY LEFF
BY Everett A. Gartrell
ATTORNEY

METHODS OF ETCHING A SEMICONDUCTOR DEVICE

Filed March 31, 1959 2 Sheets-Sheet 2

United States Patent Office 3,088,888
Patented May 7, 1963

3,088,888
METHODS OF ETCHING A SEMICONDUCTOR DEVICE

Jerry Leff, Hyde Park, N.Y., assignor to International Business Machines Corporation, New York, N.Y., a corporation of New York
Filed Mar. 31, 1959, Ser. No. 803,190
6 Claims. (Cl. 204—143)

The present invention relates to semiconductor devices which include a body of semiconductor material having one or more rectification barriers therein, and to the methods of etching about those barriers to improve the electrical properties of the devices.

Semiconductor devices having rectification barriers therein are sometimes referred to as PN junction devices. The PN junctions thereof comprise zones of P-type and N-type semiconductor material separated by a rectification barrier which has a high resistivity to electrical current flowing in one direction and a low resistivity to such flow in the opposite direction. Semiconductor diodes and transistors are two types of semiconductor devices, the diode having a single PN junction while the transistor has two or more such junctions.

Semiconductor devices may be prepared in three ways or in combinations thereof. According to one procedure, the regions of different conductivity with the PN junctions therebetween are formed by a crystal-drawing process wherein a crystal is drawn from a molten semiconductor material to which selected active impurity metals are added in a predetermined order. In accordance with another technique, a semiconductor body of a given conductivity type is exposed to the vapor of an active impurity which diffuses into the body and creates a rectification barrier and also a region having electrical properties complementary to that of the starting body. Pursuant to a third method, known as the alloy process, a pellet or dot of an active impurity metal is alloyed at an elevated temperature to a wafer of semiconductor material of a conductivity type opposite that imparted by the impurity dot. Active impurities are classified as either donors, such as antimony, arsenic, and phosphorous, or as acceptors such as indium, gallium, boron, and aluminum. Donor impurity dots are alloyed to P-type semiconductor starting wafers and N-type impurity dots are alloyed to P-type wafers. These semiconductor wafers are monatomic semiconductor crystalline members of germanium, silicon, germanium-silicon alloy, or intermetallic compounds such as indium antimonide, aluminum arsenide, aluminum antimonide, and others having the properties of a semiconductor material. Semiconductor devices may also be made by employing a diffusion technique for making one junction and an alloying technique for making the other junction of a transistor.

In the alloying process, it has been found desirable to form the dot not of the active impurity metal alone but of the impurity alloyed with an inert metal such as lead which does not affect the conductivity type of the semiconductor material. The use of lead as a carrier or solvent for the impurity-yielding material not only facilitates handling the active impurity but also reduces heat-induced mechanical strains that may arise between the semiconductor wafer and the electrode formed by the alloying process. However, difficulty is encountered because of the tendency of the lead-containing dots to flow at the alloying temperature beyond the peripheral barrier region and create a short circuit across the PN junction. Various chemical and electrolytic etches have been employed to remove the short circuiting material, a common method being to etch electrolytically the PN junction in an alkaline solution with a forward or a reverse bias on the junction. Such treatments have met with moderate success but have not resulted in the production of semiconductor devices such as transistors having the high electrical characteristics required for some applications. For example, it has been found that the junction breakdown voltage and the current gain have been too low and the junction capacitance of transistors subject to prior etching techniques has been too high. Furthermore, prior etching procedures have not been effective to yield or recover a sufficiently high percentage of transistors which meet rigid electrical requirements, thus making those techniques unattractive for many applications.

It is an object of the present invention, therefore, to provide a new and improved method of etching semiconductor devices having rectification barriers therein, which method aids in producing devices affording improved electrical performance.

It is another object of the invention to provide a new and improved method of etching PN junction devices formed by an alloying operation.

It is a further object of the invention to provide a new and improved method of etching transistors having graded-base regions and alloy junctions therein associated with those base regions.

It is another object of the invention to provide a new and improved method of etching transistors to improve the current gain thereof.

It is an additional object of the invention to provide a new and improved method of etching transistors to reduce the number thereof which are rejected during manufacture for failure to meet rigid performance specifications.

It is a still further object of the invention to provide a new and improved transistor pursuant to the etching technique employed subsequent to the junction formation.

In accordance with a particular form of the invention, the method of etching a semiconductor device which includes a body of semiconductor material having a diffused layer and a PN junction formed in that layer by alloying with a metal impurity in a lead carrier which flow during the alloying and create an undesirable low impedance path across the peripheral region of the junction, comprises subjecting the device to the influence of a solution comprising 96 parts water, 32 parts glacial acetic acid and 5 parts of 30% hydrogen peroxide while applying for a period of several seconds to the P-type region of the body a voltage which is positive with respect to the solution and to an electrode immersed therein to establish a current flow of several milliamperes for removing deleterious material including the metal impurity and the lead carrier creating the low impedance path, thereby exposing the junction. The method also includes subjecting the device to an etching solution, which has chemical ingredients different from and capable of eroding the semiconductor material and the peripheral junction region at a rate faster than the first-mentioned solution, for an interval of time sufficient to remove the peripheral junction region and the semiconductor material that is contiguous therewith and extends to the higher resistance portion of the diffused layer, thereby improving the electrical properties of the device.

The foregoing and other objects, features and advantages of the invention will be apparent from the following more particular description of preferred embodiments of the invention, as illustrated in the accompanying drawings.

Figure 1:
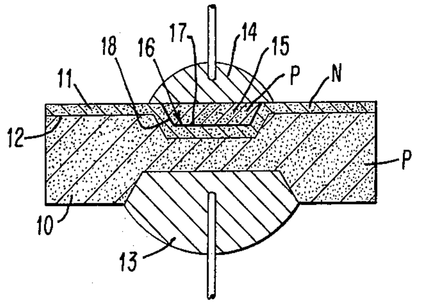
FIG. 1 is a cross-sectional view of a transistor requiring an etching treatment.
Figure 2:
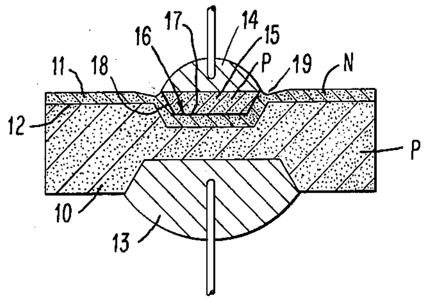
FIG. 2 is a similar view of the transistor of FIG. 1 after a conventional etching operation.

*Description of Transistor of FIGS. 1 and 2*

Referring now to FIG. 1 of the drawings, there is represented diagrammatically one type of transistor which requires an etching operation after the formation of its alloy junction. The transistor there illustrated is one of the type disclosed and claimed in the application of Robert S. Schwartz and Bernard N. Slade, Serial No. 664,069, filed July 6. 1957, now Patent No. 3,001,895, entitled "High Speed Transistor and Method of Making Same," and assigned to the same assingee as the present invention. The transistor comprises a P-type starting wafer 10 of a suitable semiconductor material such as germanium having a thin layer 11 of an N-type impurity such as antimony formed thereon in a conventional manner as by evaporation followed by diffusion at an elevated temperature. These operations create a rectification barrier 12 between the regions 10 and 11 and in turn produce a PN junction. The layer 11 forms an exponentially graded base region which has its greatest impurity concentration and hence conductivity at its outer surface. A lead-gallium collector dot 13 is alloyed to the bottom of the wafer 10 in a conventional manner to form an ohmic collector connection with the wafer 10.

Figure 5:
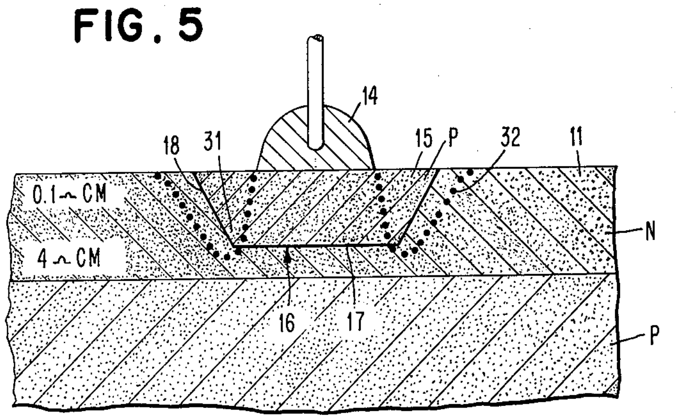
FIG. 5 is an enlarged sectional view of a portion of a transistor of FIG. 4.

A lead-gallium-antimony emitter dot 14 containing about 99.3% lead, 0.5% gallium, and 0.2% antimony is alloyed to the wafer 10. At the alloying temperature, the emitter dot melts or dissolves a portion of the germanium wafer 10 thereunder and forms a recess therein. Since the antimony in the dot has a higher diffusion coefficient than that of the gallium, it diffuses into the solid P-type material immediately surrounding the recess and converts the surrounding material into N-type which is electrically connected to the previously diffused N-type layer 11. As the assembly cools, the molten mass of lead, germanium, gallium, and antimony begins to solidify and, because the segregation coefficient of the gallium is higher than that of antimony, a recrystallized P-type region 15 develops which serves as the emitter and presents a rectification barrier or PN junction with the adjoining N-type layer 11. The rectification barrier thus formed has a planar region 17 and a peripheral region 18 which is contiguous with and angularly disposed with reference to the planar region as represented in FIG. 1. Details of the emitter-base junction may be more readily perceived in the enlarged view of FIG. 5 representing a portion of a transistor of the type under consideration. In the described alloying operation, the lead, gallium, antimony alloy material covering the P-type region 15 tends to flow outwardly beyond the peripheral region 18 of the rectification barrier 16 and to create a low-impedance path therearound which ordinarily represents a short circuit that must be removed from about the emitter-base junction.

Chemical and electrolytic etches which include a wide variety of solutions have been employed with some degree of success to remove a short circuit of the type described above. A fairly common procedure has been to employ electrolytic etching in a sodium hydroxide or phosphoric acid bath with the alloy dot that is associated with the P-type semiconductor region connected to the positive terminal of a unidirectional source that has its negative terminal connected to a suitable cathode immersed in the bath. Patent 2,802,159 to Stump discloses such a procedure. A treatment of this type reduces the size of the emitter dot 14 somewhat as represented in FIG. 2 and also cuts an annular groove 19 in the N-type region 11, which groove is quite effective in exposing the outer edge of the emitter-base junction 16. As previously stated, however, this etching operation is not as effective as is desired for many applications, particularly where transistors having high performance characteristics are required.

Figure 3:
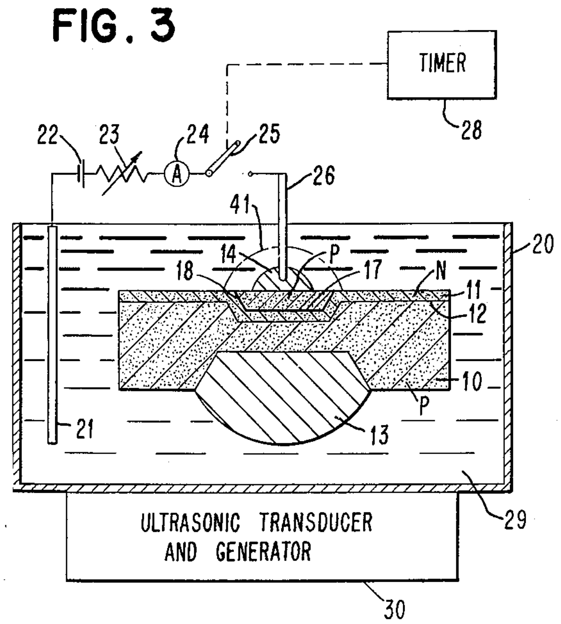
FIG. 3 is a sectional view representing the transistor of FIG. 1 and apparatus for subjecting that transistor to an etching operation in accordance with the present invention.

*Description of FIG. 3 Apparatus and Explanation of Etching Method Employed Therewith*

Referring now to FIG. 3, there is represented diagrammatically one form of an apparatus suitable for use in etching a transistor such as that represented in FIG. 1 in accordance with a method of the present invention. The transistor may be etched by subjecting at least one portion of the device which includes the rectification barrier 16 to the influence of a solution of acetic acid and hydrogen peroxide. To that end, the transistor may be chemically etched by immersing it for a suitable interval of time in a solution comprising 96 parts of water, 32 parts of glacial acetic acid, and 5 parts of 30% hydrogen peroxide held in a suitable container 20. It is to be understood that the proportions of the ingredients of the solution are only by way of example and may be varied over a wide range of proportions. The rate of etching may be controlled by the amount of water in the solution, reducing the water content being effective to increase the etching rate. Suitable solution agitating means such as an ultrasonic transducer and generator 30 on which the container 20 rests may be employed in the chemical etching procedure to assist in dislodging any material removed from about the peripheral region of the barrier to promote the etching action. It will be understood that other means such as magnetic stirrers may also be employed to perform this function. Jet etching may also be practiced.

Alternatively, the transistor may receive an electrolytic etch by connecting the negative terminal of a cathode 21 of suitable material such as stainless steel to the negative terminal of a source 22, the positive terminal of which is connected through a current-controlling resistor 23, an ammeter 24, and a switch 25 to the lead 26 associated with the emitter dot 14 of the transistor. The operation of the switch 25 is preferably controlled in a well-known manner by a conventional timer 28 that establishes the duration of the current flow, after which the transistor is removed immediately from the etching solution. The duration of the etching interval and the magnitude of the etching current are selected in relation to the diameter of the cylindrical starting dot of alloy impurity before it is alloyed to the semiconductor wafer 10. Larger dots usually dictate a larger etching interval and current. In one electrolytic etching procedure found to be extremely beneficial, transistors of the type represented in FIG. 1 and employing emitter starting dots having a diameter of about 4.5 mils, a satisfactory etching current has been found to be 10 milliamperes flowing for 35 seconds in the etching solution having the particular proportions recited above. Agitating the solution as by an ultrasonic transducer or a magnetic stirrer is usually unnecessary when electrolytic etching is practiced. For some applications it may be desirable to precede the described etching procedure with a chemical etching operation wherein the transistor is submerged in glacial acetic acid for about ten minutes. This is a surface preparation operation which removes lead oxide formation from the alloy dot and allows the subsequent electrolytic etching operation to proceed at a more predictable rate.

Prior to placing the transistor of FIG. 3 in the etching solution 29, the emitter dot 14 had the periphery represented by the dot-dash line 41 and hence corresponded in size with the dot represented in FIG. 1. The nature of the aqueous solution of acetic acid and hydrogen peroxide is such that it preferentially attacks the lead alloy regions of the transistor. In the manner well understood in the etching art, the connection of the emitter dot 14 to the positive terminal of the source 22 additionally further promotes the preferential etching of that dot and shrinks it to the size represented by the full-line outline in FIG. 3. It will be seen that the shrinking or erosion of the emitter dot exposes the upper portion of the peripheral region 18 of rectifying barrier 16 and also the corresponding region of the P-type semiconductor region 15. However, the extent of the action of the etching solution on the semiconductor material and the rectifying barrier is difficult to determine although it is known to be slight and is believed to be primarily limited to the outer surface thereof.

Figure 4:
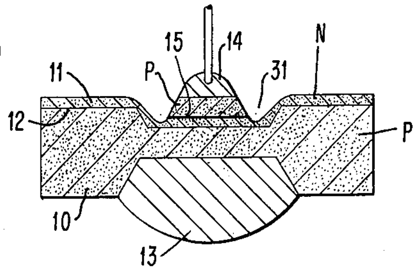
FIG. 4 is a sectional view of the transistor of FIG. 3 after having undergone an additional etching operation in accordance with the present invention.

*Description of FIG. 4 Transistor and Explanation of Method of Etching To Form It*

Exposing the peripheral region of the rectifying barrier and the corresponding region of the semiconductor material about that barrier offers very substantial benefits to any subsequent etching operation wherein the transistor, or the portion thereof including the rectifying barrier, is chemically or electrolytically etched in a solution, the latter being the type which is capable of etching the semiconductor material and the peripheral barrier region at a rate faster than that of the aqueous solution 29 for an interval of time sufficient to remove the peripheral barrier region and the semiconductor material contiguous therewith. The purpose of this subsequent etching operation is to improve the electrical properties of the transistor. A wide variety of more vigorous chemical etchants which include alkaline or acid solutions are described in the literature and may be used for this purpose. One such solution includes equal parts of 70% nitric acid, 52% hydrofluoric acid, and water while another includes 80 parts of 70% nitric acid, 50 parts of 52% hydrofluoric acid, 50 parts of 99.5% of glacial acetic acid, and 1 part bromine. Alternative electrolytic etchants which are dilute acid or alkaline solutions may be employed, a common etchant being an approximately 10% solution of sodium hydroxide.

For ease of consideration, it will be assumed that the transistor of FIG. 3 with its exposed peripheral barrier region and corresponding surrounding semiconductor regions at the emitter-base junction has been removed from the bath 29, suitably rinsed and then placed in a similar environment in a container 20 which now holds a dilute sodium hydroxide solution. A suitable etching current of about 10 milliamperes is allowed to flow for about 20 seconds by controlling the operation of the switch 25 via the timer 28. The etching operation selectively etches the exposed peripheral P-type region and the peripheral rectifying barrier region, and is effective to cut the rather deep annular groove 31 represented in FIG. 4 around the dot 14. In the formation of the groove 31, substantially the entire peripheral barrier region and the P-type region are removed along with a portion of the adjoining N-type material and adjoining dot material as shown in FIG. 4. Thus the remaining P-type region and the rectification barrier are considerably reduced in size and have a planar configuration.

Reference is now made to the larger illustration of FIG. 5 which more clearly demonstrates the action of the final etching operation in producing the transistor of FIG. 4. FIG. 5 represents the upper portion of the etched transistor of FIG. 3 shown immersed in the bath 29. It will be seen from FIG. 5 that a substantial portion of the P-type region 15 has been exposed by etching in the aqueous solution of acetic acid and hydrogen peroxide. An excess or abundance of the positive carriers is present in this exposed region, and when the transistor is electrolytically etched in the sodium hydroxide solution in the final etching operation, this exposed region and the peripheral barrier region are attacked more vigorously than was possible by etching techniques of the prior art wherein the P-type region had a lead-alloy shield or cap 14 thereover as represented in FIG. 2. Consequently, this factor, together with the relatively strong electric field produced across the rectification barrier by current supplied from unidirectional source, causes the material in this peripheral region under consideration to be eroded to the extent represented by the curved dotted line 32 of FIG. 5 defining the depth of the groove 31.

Transistors of the type under consideration when subjected to the two etching operations explained above show greatly improved electrical characteristics. Undesirably high emitter-base capacitances are reduced by the removal of the peripheral region of the PN junction extending at an angle to the planar region thereof. The removal of this region reduces the area of junction and, since the magnitude of the junction capacitance is directly proportional to that area, the capacitance is effectively and desirably reduced. The breakdown voltage of the emitter-base junction is also very materially improved. This may be more readily understood by considering the representation of FIG. 5 of the drawings. The resistance near the upper surface of the diffused N-type region 11 is considerably lower than that near the lower surface thereof because of the nature of the diffusing operation wherein the impurity concentration and hence the conductivity of the diffused layer is greatest near the outer surface of that layer. For example, the resistivity near the upper surface of the layer 17 may be about 0.1 ohm centimeter whereas that near the lower surface is about 4 ohm centimeter. The stop-step etching operations which are effective to form the annular groove 31 having its depth defined by the dotted line 32 of FIG. 5 effectively remove all the 0.1 ohm centimeter material from about the remaining rectification barrier region. There exists about the remaining planar rectification barrier region 17 N-type semiconductor material having the high resistivity of about 4 ohm centimeter. Because of this high resistivity, the breakdown voltage of the emitter-base junction has been found to be over twice as high as that of the transistor of FIG. 2 which was etched by a well-known method of the prior art. Other important benefits also flow from the use of the etching technique of the present invention. The current gain of PNP transistors of the type described above is from three to six times greater than that obtainable from transistors subject to conventional etching treatments. The removal of the low resistance material improves the injection efficiency and also improves the transport efficiency because surface recombination effects are reduced. Furthermore, the number of transistors rejected because of failure to meet the stringent electrical specifications has been minimized by using the etching techniques of the present invention.

The following table was compiled from information gathered in the testing of several hundred transistors of the types represented in FIG. 2 and from a similar number of the type represented in FIG. 4 of the drawings, and the information therein is useful in showing the superior qualities present in the FIG. 4 type of transistors as a result of following the etching techniques in accordance with the present invention.

| | Fig. 2 Transistors | Fig. 4 Transistors |
|---|---|---|
| Emitter-base breakdown voltage ____volts__ | 2.5 | 6.0 |
| Percent failures occasional by that voltage ____ | 20.5 | 0 |
| Percent meeting established PNP transistor emitter-base breakdown voltage specifications ____ | 53 | 95 |
| Current gain ____ | 165 | 500-1,000 |

The foregoing table demonstrates rather strikingly the superiority of the product resulting from the etching techniques in accordance with the present invention.

While the etching operation described in connection with FIG. 4 was an electrolytic one, it will be clear to those skilled in the art that a chemical etching operation may be employed in lieu of electrolytic etching.

Figure 6:
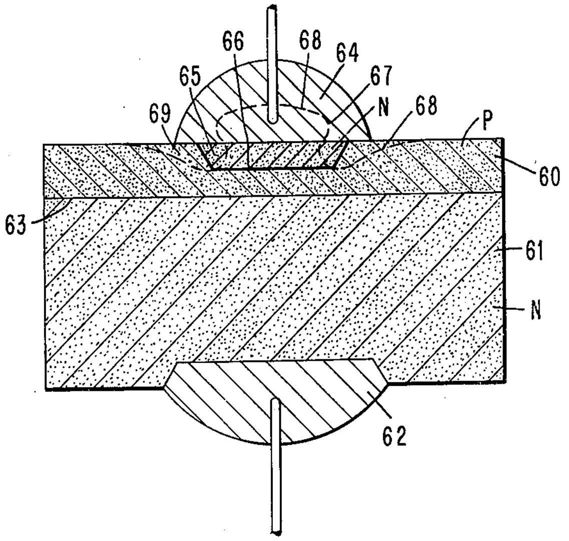
FIG. 6 is a sectional view of another type of transistor having a diffused junction and also an alloy junction that requires etching.

*Description of FIG. 6 Transistor*

Although the etching operation has been explained with reference to a transistor made in accordance with the teachings disclosed in the above-identified application of Schwartz and Slade, these operations are also applicable to other types of transistors. FIG. 6 represents a transistor having a conventional P-type region 60 diffused on one surface of an N-type semiconductor starting wafer 61, the latter further including on its lower surface a N-type ohmic collector contact 62 made from a lead-antimony alloy dot by an alloying operation. The diffusing operation results in a creation of a collector-base rectification barrier 63 which is planar over its entire area. An emitter dot 64 of a lead-antimony alloy is fused or alloyed to the P-type base region 61 to form a recrystallized N-type region 65 which is separated from the P-type region by a rectification barrier 66. During the alloying operation, the emitter dot material overflows the upper peripheral edge of the emitter-base junction and creates a short circuit which must be removed. By employing the same techniques disclosed in connection with FIGS. 3 and 4 of the drawings wherein the transistor is etched first in the aqueous solution of acetic acid and hydrogen peroxide followed by a subsequent etching in the sodium hydroxide solution, the configuration of the emitter dot in the upper surface of the P-type base region and the peripheral region of the P-N junction is eroded to a depth defined by the broken line 68, thereby forming a groove 69 in the upper portion of the transistor. During the final electrolytic etching operation in the sodium hydroxide solution, the emitter dot was connected to the positive terminal of the etching source and, since that dot contained an N-type impurity, the dot which remained after that electrolytic operation was undercut in such a manner as to create an overhanging portion 67 which does not appear in the dot 14 of the FIG. 4 transistor. The etching operation of the present invention as applied to several hundred NPN transistors of the type represented in FIG. 6 produces transistors with emitter-base junctions having a capacitance of 6 micromicrofarads, and no failures were experienced at that junction, whereas prior art etching operations on transistors of this type resulted in the corresponding capacitance of 13 micromicrofarads, and a 30% failure was encountered at that junction.

Figure 7:
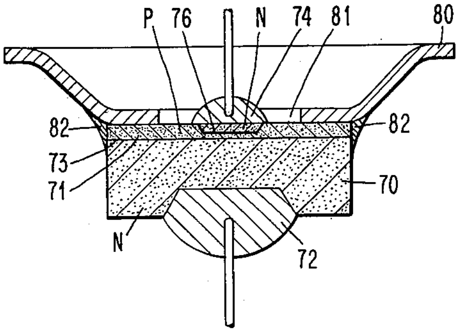
FIG. 7 is a similar view of a transistor which includes a base tab that is bonded to the semiconductor wafer and which requires an etching treatment.

*Description of FIG. 7 Transistor*

In the manufacture of transistors, it is sometimes desirable to perform the various etching operations thereon after the conductive base tab which serves as a base terminal is bonded to the base region in some suitable manner. FIG. 7 represents a transistor generally similar to the one illustrated in FIG. 6. Accordingly, corresponding elements of the FIG. 7 transistor are identified by the same reference numerals employed in FIG. 6 but with the number 10 added thereto. The FIG. 7 transistor includes a dished base tab 70 having an aperture 81 centered about the emitter dot 74, the base tab being secured to the base region 71 by a quick-heating operation wherein a tin-lead brush plating on the surface of the tab engaging the P-type region 71 serves to bond the tab to the semiconductor wafer. During the bonding procedure, some of the tin-lead plating material flows out to the periphery of the semi-conductor material and creates an undesirable mass 82 which undesirably short circuits the rectification barrier 73. The initial etching operation in accordance with the present invention in the water solution of acetic acid and hydrogen peroxide is effective simultaneously to remove the short circuiting material from the emitter-base junction and also from about the collector base junction without impairing the bond between the base tab and the base region 71. By eliminating a separate step in the manufacture of transistors, a savings is effected.

From the foregoing description and explanations, it will be seen that transistors etched in accordance with the procedures of the present invention exhibit surprisingly improved electrical characteristics as compared with similar devices etched in accordance with prior practices.

While the invention has been particularly shown and described with reference to preferred embodiments thereof, it will be understood by those skilled in the art that th foregoing and other changes in form and details may be made therein without departing from the spirit and scope of the invention.

What is claimed is:

1. The method of etching a semiconductor device which includes a body of semiconductor material having a diffused layer and a PN junction formed in said layer by alloying with a metal impurity in a lead carrier which flow during said alloying and create an undesirable low impedance path across the peripheral region of said junction, comprising:

subjecting said device to the influence of a solution comprising 96 parts of water, 32 parts glacial acetic acid and 5 parts of 30% hydrogen peroxide while applying for a period of several seconds to the P-type region of said body a voltage which is positive with respect to said solution and to an electrode immersed therein to establish a current flow of several milliamperes for removing deleterious material including said metal impurity and said lead carrier creating said low impedance path, thereby exposing said junction; and subjecting said device to an etching solution, which has chemical ingredients different from and capable of eroding said semiconductor material and said peripheral junction region at a rate faster than said first-mentioned solution, for an interval of time sufficient to remove said peripheral junction region and the semiconductor material that is contiguous therewith and extends to the higher resistance portion of said diffused layer, thereby improving the electrical properties of said device.

2. The method of etching a semiconductor device which includes a body of semiconductor material having a diffused layer and a PN junction formed in said layer by alloying with a metal impurity in a lead carrier which flow during said alloying and create an undesirable low impedance path across the peripheral region of said junction, comprising:

immersing said device in a solution comprising 96 parts water, 32 parts glacial acetic acid and 5 parts of 30% hydrogen peroxide while applying for a period of several seconds to the P-type region of said body a voltage which is positive with respect to said solution and to an electrode immersed therein to establish a current flow of several milliamperes for removing deleterious material including said metal impurity and said lead carrier creating said low impedance path, thereby exposing said junction; and immersing said device in an etching solution, which has chemical ingredients different from and capable of eroding said semiconductor material and said peripheral junction region at a rate faster than said first-mentioned solution, for an interval of time sufficient to remove said peripheral junction region and the semiconductor material that is contiguous therewith and extends to the higher resistance portion of said diffused layer, thereby improving the electrical properties of said device.

3. The method of etching a semiconductor device which includes a body of semiconductor material having a diffused layer and a PN junction formed in said layer by alloying with a metal impurity in a lead carrier which flow during said alloying and create an undesirable low impedance path across the peripheral region of said junction, comprising:

immersing said device to the influence of a solution comprising 96 parts water, 32 parts glacial acetic acid and 5 parts of 30% hydrogen peroxide while applying for a period of about 35 seconds to the P-type region of said body a voltage which is positive with respect to said solution and to an electrode immersed therein to establish a current flow of about 10 milliamperes for removing deleterious material including said metal impurity and said lead carrier creating said low impedance path, thereby exposing said junction; and immersing said device in an etching solution, which has chemical ingredients different from and capable of eroding said semiconductor material and said peripheral junction region at a rate faster than said first-mentioned solution, for an interval of time sufficient to remove said peripheral junction region and the semiconductor material that is contiguous therewith and extends to the higher resistance portion of said diffused layer, thereby improving the electrical properties of said device.

4. The method of etching a semiconductor device which includes a body of semiconductor material having a diffused layer and a PN junction formed in said layer by alloying with a metal impurity in a lead carrier which flow during said alloying and create an undesirable low impedance path across the peripheral region of said junction, comprising:

subjecting said device to the influence of a solution comprising 96 parts water, 32 parts glacial acetic acid and 5 parts of 30% hydrogen peroxide while applying for a period of several seconds the P-type region of said body a voltage which is positive with respect to said solution and to an electrode immersed therein to establish a current flow of several milliamperes for removing deleterious material including said metal impurity and said lead carrier creating said low impedance path, thereby exposing said junction; and subjecting said device to an etching solution, which has chemical ingredients different from and capable of eroding said semiconductor material and said peripheral junction region at a rate faster than said first-mentioned solution, and applying to one of the P-type and N-type regions of said body a voltage which is positive with respect to said second-mentioned solution and an electrode immersed therein for an interval of time sufficient to remove said peripheral junction region and the semiconductor material that is contiguous therewith and extends to the higher resistance portion of said diffused layer, thereby improving the electrical properties of said device.

5. The method of etching a semiconductor device which includes a body of semiconductor material having a diffused layer and a PN junction formed in said layer by alloying with a metal impurity in a lead carrier which flow during said alloying and create an undesirable low impedance path across the peripheral region of said junction, comprising:

immersing said device in a solution comprising 96 parts water, 32 parts glacial acetic acid and 5 parts of 30% hydrogen peroxide while applying for a period of several seconds to the P-type region of said body a voltage which is positive with respect to said solution and to an electrode immersed therein to establish a current flow of several milliamperes for removing deleterious material including said metal impurity and said lead carrier creating said low impedance path, thereby exposing said junction; and immersing said device in an aqueous solution of a hydroxide selected from the group consisting of sodium and potassium hydroxide and applying to said P-type region a voltage which is positive with respect to said aqueous solution and an electrode immersed therein to establish a current flow of several milliamperes for several seconds to remove said peripheral junction region and the semiconductor material that is contiguous therewith and extends to the higher resistance portion of said diffused layer, thereby improving the electrical properties of said device.

6. The method of etching a semiconductor device which includes a body of semiconductor material having a diffused layer and a PN junction formed in said layer by alloying with a metal impurity in a lead carrier which flow during said alloying and create an undesirable low impedance path across the peripheral region of said junction, comprising:

immersing said device in glacial acetic acid for about 10 minutes to remove an oxide formation associated with said metal impurity and lead carrier;

immersing said device in a solution comprising 96 parts water, 32 parts glacial acetic acid and 5 parts of 30% hydrogen peroxide while applying for a period of several seconds to the P-type region of said body a voltage which is positive with respect to said solution and to an electrode immersed therein to establish a current flow of several milliamperes for removing deleterious material including said metal impurity and said lead carrier creating said low impedance path, thereby exposing said junction; and immersing said device in a 10% sodium hydroxide solution and applying to said P-type region a voltage which is positive with respect to said hydroxide solution and an electrode immersed therein to establish a current flow of about 10 milliamperes for about 20 seconds to remove said peripheral junction region and the semiconductor material that is contiguous therewith and extends to the higher resistance portion of said diffused layer, thereby improving the electrical properties of said device.

References Cited in the file of this patent

UNITED STATES PATENTS

| | | |
|---|---|---|
| 825,883 | Heinrici | July 10, 1906 |
| 2,530,110 | Woodyard | Nov. 14, 1950 |
| 2,619,414 | Heidenreich | Nov. 25, 1952 |
| 2,656,496 | Sparks | Oct. 20, 1953 |
| 2,689,785 | Simon | Sept. 21, 1954 |
| 2,736,639 | Ellis | Feb. 28, 1956 |
| 2,783,197 | Herbert | Feb. 26, 1957 |
| 2,802,159 | Stump | Aug. 6, 1957 |
| 2,861,932 | Pohl | Nov. 25, 1958 |
| 2,963,411 | Scott | Dec. 6, 1960 |
| 2,980,597 | Mazond | Apr. 18, 1961 |